(12) United States Patent
Nakao et al.

(10) Patent No.: US 11,721,548 B2
(45) Date of Patent: Aug. 8, 2023

(54) METHOD FOR FORMING SEMICONDUCTOR LAYER

(71) Applicant: Nippon Telegraph and Telephone Corporation, Tokyo (JP)

(72) Inventors: Ryo Nakao, Tokyo (JP); Tomonari Sato, Tokyo (JP)

(73) Assignee: Nippon Telegraph and Telephone Corporation, Tokyo (JP)

( * ) Notice: Subject to any disclaimer, the term of this patent is extended or adjusted under 35 U.S.C. 154(b) by 229 days.

(21) Appl. No.: 17/299,524

(22) PCT Filed: Nov. 19, 2019

(86) PCT No.: PCT/JP2019/045212
§ 371 (c)(1),
(2) Date: Jun. 3, 2021

(87) PCT Pub. No.: WO2020/116148
PCT Pub. Date: Jun. 11, 2020

(65) Prior Publication Data
US 2022/0028689 A1 Jan. 27, 2022

(30) Foreign Application Priority Data
Dec. 4, 2018 (JP) .................. 2018-227044

(51) Int. Cl.
*H01L 21/02* (2006.01)
*H01L 21/306* (2006.01)

(52) U.S. Cl.
CPC .. *H01L 21/02546* (2013.01); *H01L 21/02178* (2013.01); *H01L 21/02241* (2013.01); *H01L 21/02488* (2013.01); *H01L 21/02502* (2013.01); *H01L 21/02505* (2013.01);
(Continued)

(58) Field of Classification Search
CPC ......... H01L 21/02546; H01L 21/02178; H01L 21/02241; H01L 21/02488; H01L 21/02502; H01L 21/02505; H01L 21/30608; H01L 21/02381; H01L 21/02461; H01L 21/02463
See application file for complete search history.

(56) References Cited

U.S. PATENT DOCUMENTS 9,269,569 B1 * 2/2016 Han .................. H01L 21/02524
2011/0212603 A1 * 9/2011 Arena ............... H01L 21/02458
257/E21.09

(Continued)

OTHER PUBLICATIONS

K. Akita et al., "Observation of Etch Pit Producted in InP by New Etcants", Journal of Crystal Growth, vol. 46, 1979, pp. 783-787, 6 pages. As discussed in the specification.
(Continued)

*Primary Examiner* — David Vu
*Assistant Examiner* — Brandon C Fox
(74) *Attorney, Agent, or Firm* — Slater Matsil, LLP

(57) ABSTRACT

In an embodiment, a first recess and a second recess, designed to reach a first semiconductor layer, are formed in the portions of a first threading dislocation and a second threading dislocation having reached the surface. Further, the first semiconductor layer is oxidized through the first recess and the second recess to form an insulating film configured to cover the lower surface of a second semiconductor layer.

7 Claims, 3 Drawing Sheets

(52) U.S. Cl.
CPC .. *H01L 21/30608* (2013.01); *H01L 21/02381* (2013.01); *H01L 21/02461* (2013.01); *H01L 21/02463* (2013.01)

(56) References Cited

U.S. PATENT DOCUMENTS

2016/0126335 A1* 5/2016 Fogel ................. H01L 21/0262
                                                              438/429
2018/0277368 A1* 9/2018 Bedell ............... H01L 21/02614

OTHER PUBLICATIONS

L. Czornomaz et al., "Confined Epitaxial Lateral Overgrowth (CELO): A Novel Concept for Scalable Integration of CMOS-compatible InGaAs-on-insulator MOSFETs on Large-Area Si Substrates", Symposium on VLSI Technology Digest of Technical Papers, 13-3, 2015, pp. T172-T173, 2 pages. As discussed in the specification.

H. Kataria et al., "Simple Epitaxial Lateral Overgrowth Process as a Strategy for Photonic Integration on Silicon", IEEE Journal of Selected Topics in Quantum Electronics, vol. 20, No. 4, Jul./Aug. 2014, 8 pages. As discussed in the specification.

Y. Hirai et al., "Characterization of the Oxide Film Obtained by Wet Oxidation of Al-Rich AlGaAs", Japanese Journal of Applied Physics, vol. 51, 2012, 6 pages. As discussed in the specification.

R. Hull, et al., "Role of strained layer superlattices in misfit dislocation reduction in growth of epitaxial Ge0.5Si0.5 alloys on Si(100) substrates", Journal of Applied Physics, vol. 65, No. 12, 1989, pp. 4723-4729, 8 pages. As discussed in the specfication.

M. Ishii et al., "Etch Pit Observation of Very Thin {001}-GaAs Layer by Molten KOH", Japanese Journal of Applied Physics, vol. 15, No. 4, Apr. 1976, pp. 645-650, 6 pages. As discussed in the specification.

J. G. Fiorenza et al., "Aspect Ratio Trapping: A Unique Technology for Integrating Ge and III-Vs with Silicon CMOS", ECS Transactions, vol. 33, No. 6, 2010, pp. 963-976, 14 pages. As discussed in the specficiation.

* cited by examiner

METHOD FOR FORMING SEMICONDUCTOR LAYER

CROSS-REFERENCE TO RELATED APPLICATIONS

This application is a national phase entry of PCT Application No. PCT/JP2019/045212, filed on Nov. 19, 2019, which claims priority to Japanese Application No. 2018-227044, filed on Dec. 4, 2018, which applications are hereby incorporated herein by reference.

TECHNICAL FIELD

The present invention relates to a method for forming semiconductor layers, and relates to a method for forming a semiconductor layer in which a semiconductor with a lattice constant different from that of a substrate is crystal-grown on the substrate.

BACKGROUND

Semiconductor thin films are used as materials for electronic devices, optical devices, and the like. Many of the semiconductors utilized as devices take layer structures, and are crystal-grown on substrates of a semiconductor, sapphire, and the like by using crystal growth equipment. Crystal growth has been performed in such a manner as to achieve lattice matching with respect to a substrate. However, for the purpose of mass production and an improvement in device characteristics, lattice mismatch-based growth (heteroepitaxial growth), such as crystal growth of GaN on a sapphire substrate and crystal growth of a compound semiconductor on a Si substrate, is also performed these days.

In the heteroepitaxial growth, various crystal defects are introduced at the hetero interface, and thread into a layer (device layer) that constitutes a semiconductor electronic and optical device. Since the threading defect causes deterioration in device characteristics, it is important to suppress the threading defect (threading dislocation density). Several techniques to reduce threading dislocation density have been proposed, and examples of such techniques include epitaxial lateral overgrowth (ELO), Aspect Ratio Trapping (ART), Confined Epitaxial Lateral Overgrowth (CELO), and a dislocation filter by Strained Layer Superlattice (SLS).

For example, in ELO described in Non Patent Literature (NPL) 1, a material such as SiO2 is deposited on a semiconductor substrate, where heteroepitaxial growth is to be conducted, to form a mask, an opening is provided in part of the mask, and then crystal growth is conducted from a surface of the semiconductor substrate exposed to a bottom surface of the opening. In this crystal growth, by using growth conditions that allow the crystal of the semiconductor to grow right above the mask opening and additionally grow to cover the mask around the opening, it is possible to suppress the propagation of dislocation from the substrate, in the semiconductor layer formed on the mask. However, in ELO, since there is no effect of suppressing the dislocation propagation in the opening of the mask, it is difficult to reduce the dislocation density of the grown semiconductor layer across the entire area of the substrate in the planar direction. Furthermore, crystal growth in the lateral direction on the mask around the opening is difficult to conduct as compared to crystal growth in the vertical direction on a plane of a common substrate, and the shape of the mask, the shape of the opening in a plan view, and the like are restricted, thereby a problem arises where a required semiconductor device structure may not be necessarily manufactured for the semiconductor layer formed on the mask, or the like.

Next, ART described in NPL 2 will be described. ART is a method for terminating dislocation at an inner wall of an opening by forming a mask that is provided with the opening in a stripe structure with a large ratio of the thickness to the length (width) in the planar direction (aspect ratio), and selectively performing crystal growth on the substrate surface at a location of the opening. However, although there exists an effect of suppressing the dislocation propagation in a direction orthogonal to the direction in which the stripe extends, the dislocation propagation may not be suppressed due to the absence of an inner wall in the direction in which the stripe extends. In addition, when the growth is conducted with a large aspect ratio, there arise a problem in which a region capable of growing becomes small, and a problem in which the grown surface is not flat.

Next, CELO described in NPL 3 will be described. CELO is a method for significantly lowering the dislocation density by processing an insulating film formed on a substrate so as to form a thin channel in a surface of the substrate, and supplying a raw material via this channel to conduct the growth. However, in the CELO, the manufacture of the channel structure is complicated, and a region capable of growing is extremely small. Furthermore, in the CELO, the growth itself is difficult because the growth is required to be performed also on a crystal surface other than the vertical method of the substrate surface.

Next, SLS described in NPL 4 will be described. In SLS, a dislocation filter is used. Since this dislocation filter is easy to manufacture, SLS has been widely used. On the other hand, in the SLS, because an effect of the reduction in dislocation density is small, and a layer made of an insulating material is not formed, it is not always possible to prevent a rise of the dislocation from the substrate side upward in a direction in which there exists a layer where a device is formed, after the manufacture of the device structure.

CITATION LIST

Non Patent Literature

NPL 1: H. Kataria et al., "Simple Epitaxial Lateral Overgrowth Process as a Strategy for Photonic Integration on Silicon", IEEE Journal of Selected Topics in Quantum Electronics, vol. 20, no. 4, 8201407, 2014.
NPL 2: J. G. Fiorenza et al., "Aspect Ratio Trapping: A Unique Technology for Integrating Ge and III-Vs with Silicon CMOS", ECS Transactions, vol. 33, no. 6, pp. 963-976, 2010.
NPL 3: L. Czornomaz et al., "Confined Epitaxial Lateral Overgrowth (CELO): A Novel Concept for Scalable Integration of CMOS-compatible InGaAs-on-insulator MOSFETs on Large-Area Si Substrates", Symposium on VLSI Technology Digest of Technical Papers, 13-3, pp. T172-T173, 2015.
NPL 4: R. Hull. et al., "Role of strained layer superlattices in misfit dislocation reduction in growth of epitaxial Ge0.5Si0.5 alloys on Si(100) substrates", Journal of Applied Physics, vol. 65, no. 12, pp. 4723-4729, 1989.
NPL 5: Y. Hirai et al., "Characterization of the Oxide Film Obtained by Wet Oxidation of Al-Rich AlGaAs", Japanese Journal of Applied Physics, vol. 51, 02BG10, 2012.

NPL 6: M. Ishii et al., "Etch Pit Observation of Very Thin {001}-GaAs Layer by Molten KOH", Japanese Journal of Applied Physics, vol. 15, no. 4, pp. 645-650, 1976.

NPL 7: K. Akita et al., "Observation of Etch Pit Producted in I nP by New Etcants", Journal of Crystal Growth, vol. 46, pp. 783-787, 1979.

SUMMARY

Technical Problem

As described above, though various methods for reducing dislocation density when performing heteroepitaxial growth have been proposed, these techniques of the related art are unfortunately not capable of manufacturing a semiconductor layer while significantly reducing dislocation density by a simplified manufacturing method, and suppressing a rise (propagation) of dislocation to the semiconductor layer as desired after the manufacture thereof.

Embodiments of the present invention have been conceived to solve the above problems, and an object thereof is to manufacture a semiconductor layer with a reduced dislocation density by a simplified manufacturing method, and suppress a rise of dislocation to the semiconductor layer as desired after the manufacture thereof.

Means for Solving the Problem

A method for forming a semiconductor layer according to embodiments of the present invention includes: (i) crystal-growing, on a substrate, a first semiconductor layer, the first semiconductor layer having a lattice constant in a planar direction of a surface of the substrate which is different from a lattice constant of the substrate in the planar direction of the surface of the substrate; (ii) crystal-growing a second semiconductor layer on the first semiconductor layer; (iii) selectively dissolving a dislocation portion of the second semiconductor layer, and forming a recess, in the dislocation portion, which reaches the first semiconductor layer; (iv) oxidizing the first semiconductor layer through the recess, and forming an insulating film covering a lower surface of the second semiconductor layer; and (v) crystal-regrowing the second semiconductor layer after forming the insulating film.

In one configuration example of the method for forming the semiconductor layer, in step (iii), the recess is formed by etching the second semiconductor layer by an etching process with crystal anisotropy.

In one configuration example of the method for forming the semiconductor layer, the first semiconductor layer comprises a compound semiconductor containing Al, and the second semiconductor layer comprises a compound semiconductor.

In one configuration example of the method for forming the semiconductor layer, in step (i), a buffer layer is formed on the substrate, and then the first semiconductor layer is crystal-grown on the buffer layer.

In one configuration example of the method for forming the semiconductor layer, the buffer layer comprises a compound semiconductor, and is in a state in which the lattice constant of the buffer layer in the planar direction of the surface of the substrate is closer to the lattice constant of the first semiconductor layer in a planar direction of a surface of the substrate as approaching toward the first semiconductor layer.

In one configuration example of the method for forming the semiconductor layer, the lattice constant of the first semiconductor layer in the planar direction of the surface of the substrate is closer to the lattice constant of the second semiconductor layer in the planar direction of the surface of the substrate as approaching toward the second semiconductor layer.

Effects of Embodiments of the Invention

As described above, according to embodiments of the present invention, in a dislocation portion of the second semiconductor layer formed on and in contact with the first semiconductor layer, a recess configured to reach the first semiconductor layer is formed, and the first semiconductor layer is oxidized through the recess to form an insulating film configured to cover the lower surface of the second semiconductor layer, whereby a semiconductor layer with a reduced dislocation density can be manufactured by a simplified manufacturing method, and an excellent effect of suppressing a rise of the dislocation to the semiconductor layer as desired after the manufacture of the semiconductor layer can be obtained.

DETAILED DESCRIPTION OF ILLUSTRATIVE EMBODIMENTS

Forming methods for semiconductor layers according to embodiments of the present invention will be described below.

First Embodiment

First, a method for forming a semiconductor layer according to a first embodiment of the present invention will be described with reference to FIGS. 1A to 1E.

Figure 1A:
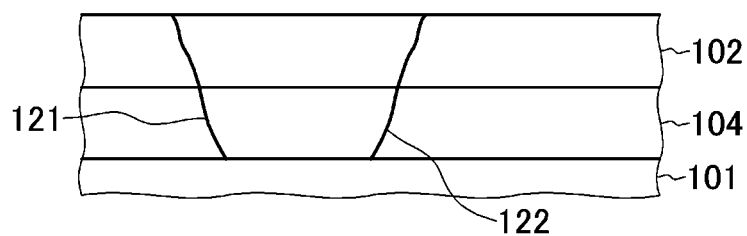
FIG. 1A is a cross-sectional view illustrating a state of a semiconductor layer in a midway stage for describing a method for forming a semiconductor layer in a first embodiment of the present invention.

First, as illustrated in FIG. 1A, on a substrate 101, a first semiconductor layer 102 with a lattice constant in a planar direction of a surface of the substrate 101 being different from that of the substrate 101 is crystal-grown (first step). In the first embodiment, a buffer layer 104 is crystal-grown on the substrate 101, and then the first semiconductor layer 102 is crystal-grown (epitaxially grown) on the buffer layer 104. The substrate 101 comprises Si, for example, and the first semiconductor layer 102 comprises AlGaAs. AlGaAs is a compound semiconductor containing Al. The buffer layer 104 comprises GaAs. The buffer layer 104 and the first semiconductor layer 102 may be formed by, for example, a metal-organic chemical vapor deposition method or a molecular beam epitaxy method.

The buffer layer 104 comprising GaAs and the first semiconductor layer 102 comprising AlGaAs each have a different lattice constant in the planar direction of the surface of the substrate 101 from that of the substrate 101 comprising Si. Due to this, in the first embodiment, at the hetero interface between the substrate 101 and the buffer layer 104, a threading dislocation 121 and a threading dislocation 122 are generated to propagate up to a surface of the first semiconductor layer 102.

Figure 1B:
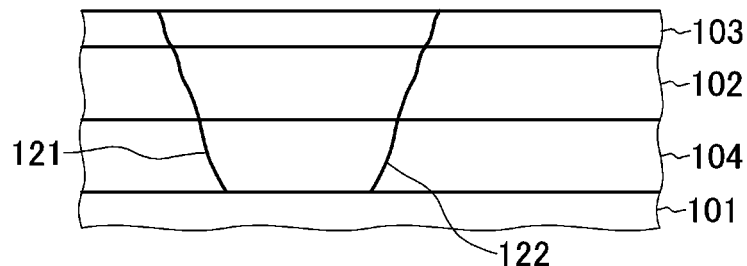
FIG. 1B is a cross-sectional view illustrating a state of a semiconductor layer in a midway stage for describing the method for forming the semiconductor layer in the first embodiment of the present invention.

Next, as illustrated in FIG. 1B, a second semiconductor layer 103 is crystal-grown on and in contact with the first semiconductor layer 102 (second step). The second semiconductor layer 103 comprises, for example, a compound semiconductor such as GaAs. The threading dislocations 121 and 122, which have propagated to the surface of the first semiconductor layer 102, propagate to a surface of the second semiconductor layer 103.

Figure 1C:
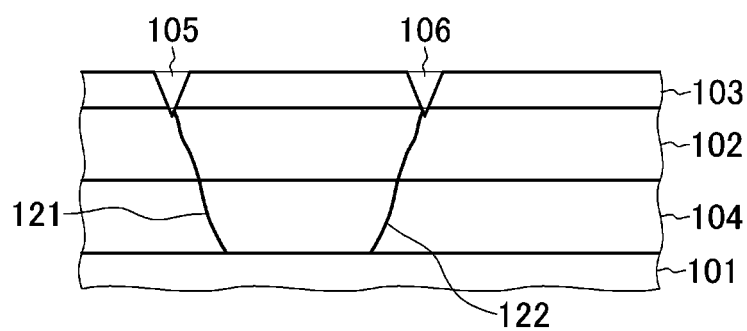
FIG. 1C is a cross-sectional view illustrating a state of a semiconductor layer in a midway stage for describing the method for forming the semiconductor layer in the first embodiment of the present invention.

Next, as illustrated in FIG. 1C, a recess 105 and a recess 106, designed to reach the first semiconductor layer 102, are formed in the portions of the threading dislocation 121 and threading dislocation 122 having reached the surface (third step). The recess 105 and the recess 106 may be formed by selectively dissolving the portions of the threading dislocation 121 and the threading dislocation 122 having reached the surface of the second semiconductor layer 103.

For example, the portions of the threading dislocations 121 and 122 having reached the surface of the second semiconductor layer 103 are etched by wet etching in which molten KOH is used as an etchant. This etching process is etching having crystal anisotropy where etching rates differ between different crystal planes of group III-V compound semiconductors such as GaAs. Thus, with the etching mentioned above, while making the etching process of the surface of the second semiconductor layer 103 less progress, it is possible to selectively etch the portions of the threading dislocations 121 and 122.

The etching process described above is used to confirm the presence or absence of dislocations and the distribution of generated dislocation portions in the crystal of a semiconductor (see NPL 6 and NPL 7). In this technique, a recess formed in a dislocation portion by the etching process is referred to as an etch-pit.

The etchant used in the etching process described above is not limited to molten KOH, and $H_2O:AgNO_3:CrO_3:HF$, $Br_2:CH_3OH$, $H_2SO_4:H_2O_2:H_2O$, $NH_4OH:H_2O_2$, $HF:HNO_3:H_2O$, and the like are applicable to the etchant.

Figure 1D:
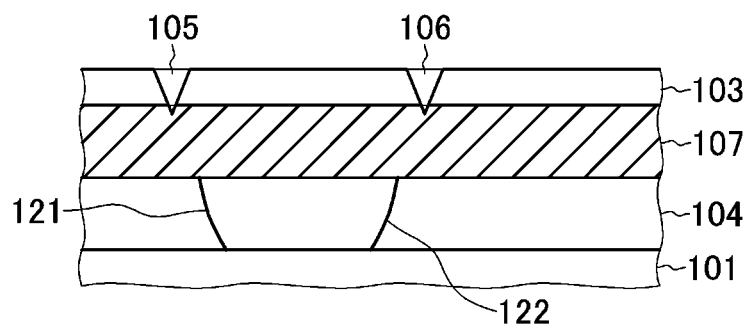
FIG. 1D is a cross-sectional view illustrating a state of a semiconductor layer in a midway stage for describing the method for forming the semiconductor layer in the first embodiment of the present invention.

Next, the first semiconductor layer 102 is oxidized through the recess 105 and the recess 106, and as illustrated in FIG. 1D, an insulating film 107 covering the lower surface of the second semiconductor layer 103 is formed (fourth step). In the first embodiment, the insulating film 107 in an amorphous state is formed by oxidizing the whole first semiconductor layer 102. For example, the insulating film 107 is formed by oxidizing AlGaAs by well-known steam thermal oxidation. According to NPL 5, AlGaAs having an Al composition ratio of 80% or higher is referred to as capable of being oxidized, and the first semiconductor layer 102 preferably comprises AlGaAs having such composition.

Figure 1E:
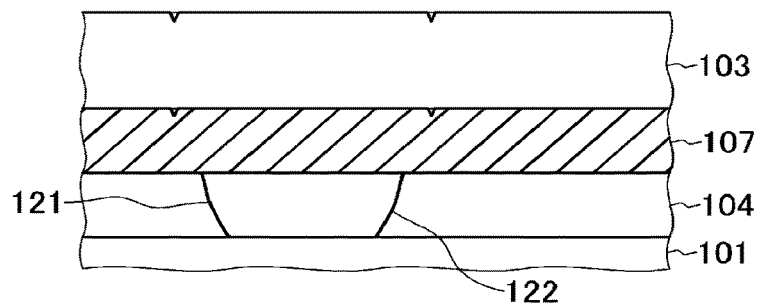
FIG. 1E is a cross-sectional view illustrating a state of a semiconductor layer in a midway stage for describing the method for forming the semiconductor layer in the first embodiment of the present invention.

Next, after forming the insulating film 107, the second semiconductor layer 103 is crystal-regrown, and as illustrated in FIG. 1E, the thickness of the second semiconductor layer 103 is made larger than that of the initial state (fifth step). By making the second semiconductor layer 103 thicker through the crystal regrowth, the recess 105 and recess 106 are reduced in depth and the surface of the second semiconductor layer 103 is made relatively flat.

Figure 2:
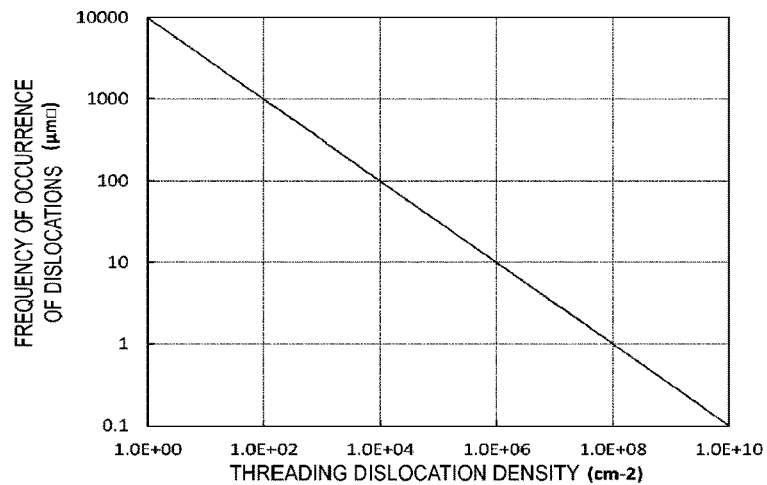
FIG. 2 is a characteristics diagram depicting a relationship between threading dislocation density generated in a semiconductor layer formed by crystal-growth of a nitride semiconductor with a different lattice constant in a planar direction of a surface of a growth substrate, and a length of one side of a rectangular region in a plan view containing an average of one dislocation.

In the formation of the recess 105 and the recess 106, the relationship between the hole diameter of a shape in a plan view of the recess 105 and the recess 106, and the density of the threading dislocation 121 and the threading dislocation 122 is important. FIG. 2 depicts a relationship between threading dislocation density generated in a semiconductor layer formed by crystal-growth of a nitride semiconductor with a different lattice constant in a planar direction of a surface of a growth substrate, and a length (region dimension) of one side of a rectangular region in a plan view containing an average of one dislocation. This relationship can be calculated with an equation of $L=1/\sqrt{D}$, where the threading dislocation density is taken as D and the region dimension is taken as L. For example, when the threading dislocation density is $10^8$ cm$^{-2}$, it means that one threading dislocation is contained in a square with one side being 1 μm in a plan view.

For example, in a case where recesses are formed in a semiconductor layer with a threading dislocation density of $10^8$ cm$^{-2}$, when the size of the diameter in a plan view of the recess exceeds 1 μm, the recesses adjacent to each other are joined to each other, whereby the whole semiconductor layer is etched. Because of this, in the formation of the recesses, it is necessary to make the size of the diameter in the plan view be less than or equal to the frequency of occurrence of dislocations (threading dislocation density).

In addition, it is important that the recess 105 and the recess 106 pass through the second semiconductor layer 103 to reach the second semiconductor layer 103. The shapes of the recess 105 and the recess 106 vary depending on the material of the second semiconductor layer 103 and the etchant used to form the recess 105 and the recess 106. Because of this, it is necessary to grasp, in advance, the diameter size in a plan view, the depth, and the like of the recess 105 and the recess 106 to be formed. This may be done by observing experimentally formed recesses under an optical microscope or electron microscope.

For example, in a case where a recess with a ratio of the diameter size in a plan view and the depth (aspect ratio) being one is formed, the thickness of a semiconductor layer in which the recess is formed needs to be equal to or less than the thickness of the frequency of occurrence of dislocations depicted in FIG. 2, and the size of the diameter in the plan view of the recess to be formed needs to be equal to or less than the thickness of the semiconductor layer. In a case where the aspect ratio of the recess is different, the semiconductor layer needs to be manufactured, with this ratio, to have a thickness such that the recess passes through the semiconductor layer to reach a lower layer.

According to the first embodiment described above, no threading dislocation is present in the second semiconductor layer 103. The threading dislocation 121 and the threading dislocation 122 generated at the hetero interface between the substrate 101 and the buffer layer 104 do not propagate to a layer above the insulating film 107, so that no threading dislocation propagates to the second semiconductor layer 103 above the insulating film 107. As described above, according to the first embodiment, it is possible to manufacture a semiconductor layer with a reduced dislocation density, and suppress a rise of the dislocation to the semiconductor layer as desired after the manufacture of the semiconductor layer. In addition, according to the first embodiment described above, the crystal growth technique and the recess forming technique of the related art generally used are used, thereby making it possible to manufacture a semiconductor layer in a very simplified manner.

Figure 3:
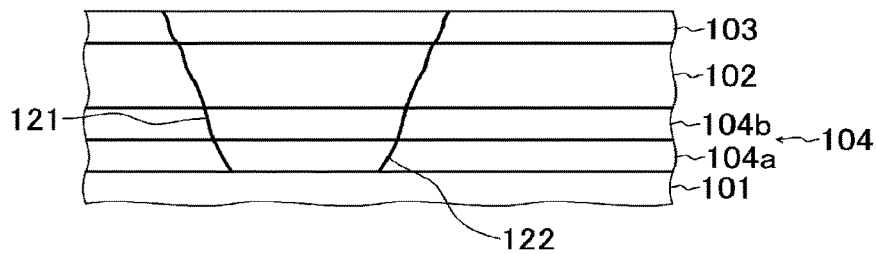
FIG. 3 is a cross-sectional view illustrating a state of a semiconductor layer in a midway stage for describing the method for forming a modification of the semiconductor layer in the first embodiment of the present invention.

As illustrated in FIG. 3, the buffer layer 104 may have a layered structure including a first buffer layer 104a comprising GaAs and a second buffer layer 104b comprising InP. In this case, the first semiconductor layer 102 comprises InAlAs, and the second semiconductor layer 103 comprises InP. The substrate 101 comprising Si, the first buffer layer 104a comprising GaAs, and the second buffer layer 104b comprising InP are so designed that the respective lattice constants thereof in the planar direction of the surface of the substrate 101 are increased in sequence from the lower side toward the upper side.

In this kind of heteroepitaxial growth, a sudden large change in lattice constant may bring about a three-dimensional growth of the crystal in an island shape, a significant loss of crystallinity, or the like. In order to suppress such problems, the buffer layer 104 comprises the first buffer layer 104a and the second buffer layer 104b, thereby preventing the occurrence of a large change in lattice constant. Although the change in lattice constant is allowed to occur in two stages by the buffer layer being constituted of two layers, it is also possible that the change in lattice constant is allowed to occur in multiple stages by the buffer layer being constituted of a larger number of layers. In other words, in the case where the lattice constant of the buffer layer in the planar direction of the surface of the substrate changes to the state of approaching the lattice constant of the first semiconductor layer in the planar direction of the surface of the substrate toward the first semiconductor layer, the crystal growth problem discussed above may be suppressed.

$Br_2$:$CH_3OH$, HBr:$H_2O_2$:HCl:$H_2O$, $HNO_3$:HCl:$Br_2$, $H_3PO_4$:HBr, HBr:$HNO_3$, HBr:HF, HBr:$CH_3COOH$, and the like are applicable to the etchant used when forming the recess 105 and the recess 106 in the second semiconductor layer 103 comprising InP.

As described above, by making the buffer layer 104 include multiple layers to suppress a large change in lattice constant, the dislocation density in the initial stage may be reduced. The reduction in dislocation density in the initial stage increases the degrees of freedom of the recess dimensions and the thickness of the second semiconductor layer 103, and therefore the reduction in dislocation density in the initial stage is important in embodiments of the present invention. The reduction in dislocation density in the initial stage is achieved by, in addition to making the buffer layer have a multilayer structure as described above, thermal cycle annealing, Strained Layer Superlattice buffering and the like, and embodiments of the present invention may be more easily carried out by combining these schemes.

Second Embodiment

Next, a method for forming a semiconductor layer according to a second embodiment of the present invention will be described with reference to FIGS. 4A to 4E.

Figure 4A:
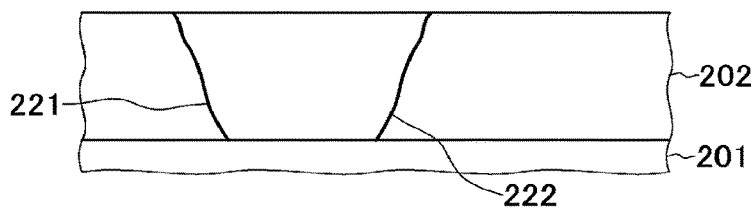
FIG. 4A is a cross-sectional view illustrating a state of a semiconductor layer in a midway stage for describing a method for forming a semiconductor layer in a second embodiment of the present invention.

First, as illustrated in FIG. 4A, on a substrate 201, a first semiconductor layer 202 with a lattice constant in a planar direction of a surface of the substrate 201 being different from that of the substrate 201 is crystal-grown (epitaxially grown) (first step). In the second embodiment, the first semiconductor layer 202 functions as a buffer layer. The substrate 201 comprises Si, for example, and the first semiconductor layer 202 comprises AlGaAs. AlGaAs is a compound semiconductor containing Al. The first semiconductor layer 202 may be formed by, for example, the metal-organic chemical vapor deposition method or the molecular beam epitaxy method. The epitaxial growth of AlGaAs onto a Si substrate has successfully been performed by molecular beam epitaxy.

Similarly to the buffer layer 104 of the first embodiment, in the first semiconductor layer 202, the lattice constant in the planar direction of the surface of the substrate 201 can also be changed to a state of approaching a lattice constant of a second semiconductor layer 203, which will be explained later, in the planar direction of the surface of the substrate toward the second semiconductor layer 203.

The first semiconductor layer 202 comprising AlGaAs has a different lattice constant in the planar direction of the surface of the substrate 201 from that of the substrate 201 comprising Si. Due to this, in the second embodiment, at the hetero interface between the substrate 201 and the first semiconductor layer 202, a threading dislocation 221 and a threading dislocation 222 are generated to propagate up to a surface of the first semiconductor layer 202.

Figure 4B:
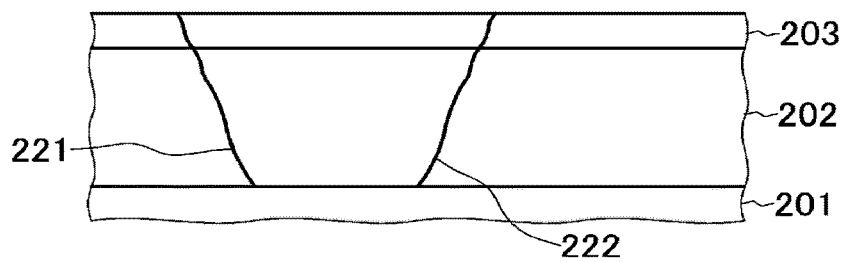
FIG. 4B is a cross-sectional view illustrating a state of a semiconductor layer in a midway stage for describing the method for forming the semiconductor layer in the second embodiment of the present invention.

Next, as illustrated in FIG. 4B, the second semiconductor layer 203 is crystal-grown on and in contact with the first semiconductor layer 202 (second step). The second semiconductor layer 203 comprises, for example, GaAs. The threading dislocations 221 and 222, which have propagated to the surface of the first semiconductor layer 202, propagate to a surface of the second semiconductor layer 203.

Figure 4C:
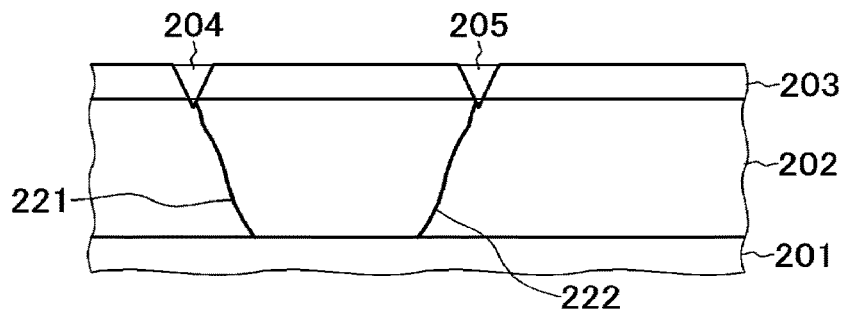
FIG. 4C is a cross-sectional view illustrating a state of a semiconductor layer in a midway stage for describing the method for forming the semiconductor layer in the second embodiment of the present invention.

Next, as illustrated in FIG. 4C, a recess 204 and a recess 205, designed to reach the first semiconductor layer 202, are formed in the portions of the threading dislocation 221 and the threading dislocation 222 having reached the surface (third step). The recess 204 and the recess 205 may be formed by selectively dissolving the portions of the threading dislocation 221 and the threading dislocation 222 having reached the surface of the second semiconductor layer 203.

The formation of the recess 204 and the recess 205 is the same as that of the first embodiment described above.

The threading dislocation density is approximately $1n^8$ cm$^{-2}$ although it varies depending on the thickness of each semiconductor layer. In this case, from the explanation using FIG. 2, the number of threading dislocations that have reached the surface of the second semiconductor layer 203 and are present in a square with one side being 1 µm, is considered to be one. In other words, an interval between the threading dislocations adjacent to each other on the surface of the second semiconductor layer 203 is approximately 1 µm. In this state, when a recess with the diameter size being approximately 0.5 µm in a plan view is formed, the second semiconductor layer 203 in a region having an average length of approximately 0.5 µm in the planar direction remains between the adjacent recesses.

Figure 4D:
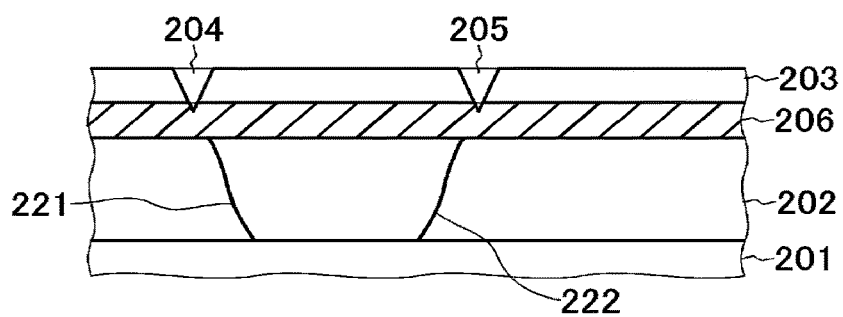
FIG. 4D is a cross-sectional view illustrating a state of a semiconductor layer in a midway stage for describing the method for forming the semiconductor layer in the second embodiment of the present invention.

Next, the first semiconductor layer 202 is oxidized through the recess 204 and the recess 205, and as illustrated in FIG. 4D, an insulating film 206 covering the lower surface of the second semiconductor layer 203 is formed (fourth step). In the second embodiment, part of the first semiconductor layer 202 in the thickness direction is all oxidized, thereby forming the insulating film 206 in an amorphous state. For example, the insulating film 206 is formed by oxidizing AlGaAs by well-known steam thermal oxidation.

Figure 4E:
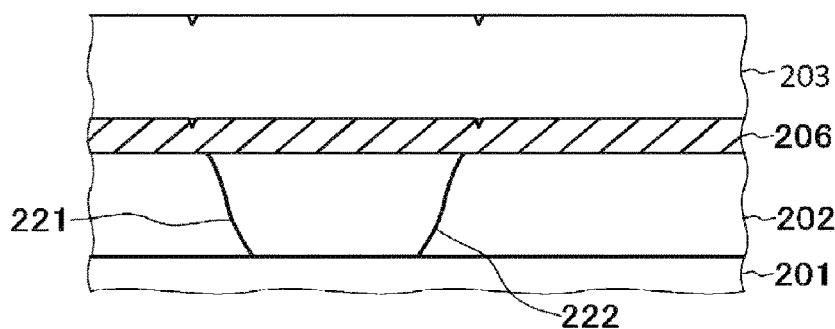
FIG. 4E is a cross-sectional view illustrating a state of a semiconductor layer in a midway stage for describing the method for forming the semiconductor layer in the second embodiment of the present invention.

Next, after forming the insulating film 206, the second semiconductor layer 203 is crystal-regrown, and as illustrated in FIG. 4E, the thickness of the second semiconductor layer 203 is made larger than that in the initial state (fifth step). By making the second semiconductor layer 203 thicker through the crystal regrowth, the recess 204 and the recess 205 are reduced in depth and the surface of the second semiconductor layer 203 is made relatively flat.

According to the second embodiment described above, no threading dislocation is present in the second semiconductor layer 203. The threading dislocation 221 and the threading dislocation 222 generated at the hetero interface between the substrate 201 and the first semiconductor layer 202 do not propagate to a layer above the insulating film 206, so that no threading dislocation propagates to the second semiconductor layer 203 above the insulating film 206. As described above, also in the second embodiment, it is possible to manufacture a semiconductor layer with a reduced dislocation density, and to suppress a rise of the dislocation to the semiconductor layer as desired after the manufacture of the semiconductor layer. In addition, also in the second embodiment, the crystal growth technique and the recess forming technique of the related art generally used are also used, thereby making it possible to manufacture a semiconductor layer in a very simplified manner.

Note that in the oxidation of the first semiconductor layer 202 via the recess 204 and the recess 205 formed in the second semiconductor layer 203, the oxidation progresses evenly from the lower end on the substrate 201 side of the recess 204 and the recess 205 in the thickness direction and the planar direction. Thus, when the interval between the adjacent recesses is 1 µm, the insulating film 206 having a thickness of 0.25 µm and covering the whole area of the lower surface of the second semiconductor layer 203 may be formed by the oxidation of at least 0.25 µm each from one recess. Accordingly, when the thickness of the first semiconductor layer 202 is equal to or less than 0.25 µm, the entire first semiconductor layer 202 is oxidized to become the insulating film 206. On the other hand, in a case where the thickness of the first semiconductor layer 202 is greater than 0.25 µm, even when the oxidation is carried out via the recesses 204 and 205 described above, part of the first semiconductor layer 202 on the substrate 201 side in the thickness direction remains unoxidized.

In order that the second semiconductor layer 203 is crystal-regrown after the insulating film 206 is formed, the oxidation rate of the second semiconductor layer 203 is required to be sufficiently slow in the oxidation process for forming the insulating film 206. Specifically, at least a part of the second semiconductor layer 203 in the thickness direction needs to remain unoxidized until the insulating film 206 covering the lower surface of the second semiconductor layer 203 is formed.

For example, in a case where the aspect ratio of the recess 204 and the recess 205 is one, the thickness of the second semiconductor layer 203 needs to be equal to or less than 0.5 µm in order that the recess 204 and the recess 205 pass therethrough, as described above. As an example, a case is considered in which the second semiconductor layer 203 with a thickness of 0.5 µm, which is the upper limit of the design, is used. In this case, in order to leave the second semiconductor layer 203 unoxidized while the first semiconductor layer 202 is being oxidized by 0.25 µm in thickness, the oxidation rate of the first semiconductor layer 202 is allowed to be up to twice the oxidation rate of the second semiconductor layer 203.

On the other hand, in a case where the diameter size in a plan view of the recess 204 and the recess 205 is five times the depth thereof (the aspect ratio is 5), when the diameter in the plan view of the recess 204 and the recess 205 is 0.5 µm, the depth is 0.1 µm. In this case, the thickness of the second semiconductor layer 203 is required to be equal to or less than 0.1 µm. In this case, in order to make part of the second semiconductor layer 203 remain while the first semiconductor layer 202 being oxidized by 0.25 µm in thickness, the oxidation rate of the second semiconductor layer 203 is required to be less than 1/2.5 of the oxidation rate of the first semiconductor layer 202.

In order to satisfy such conditions, the oxidation rate of the first semiconductor layer 202 needs to be adjusted by adjusting the Al composition of AlGaAs constituting the first semiconductor layer 202, or the like. For example, since the oxidation rate of AlGaAs is larger as the Al composition ratio is higher, it is likely to achieve a large difference in oxidation rate from the second semiconductor layer 203 comprising GaAs by making the first semiconductor layer 202 comprising AlGaAs having an increased Al composition ratio.

As described above, according to embodiments of the present invention, in a dislocation portion of the second semiconductor layer formed on and in contact with the first semiconductor layer, a recess configured to reach the first semiconductor layer is formed, and the first semiconductor layer is oxidized through the recess to form an insulating film configured to cover the lower surface of the second semiconductor layer, whereby a semiconductor layer with a reduced dislocation density can be manufactured by a simplified manufacturing method, and a rise of the dislocation to the semiconductor layer can be suppressed as desired after the manufacture of the semiconductor layer.

The present invention is not limited to the embodiments described above, and it is obvious that many modifications and combinations can be implemented by a person having ordinary knowledge in the field within the technical spirit of the present invention.

REFERENCE SIGNS LIST

101 Substrate
102 First semiconductor layer

103 Second semiconductor layer
104 Buffer layer
105 Recess
106 Recess
107 Insulating film
121 Threading dislocation
122 Threading dislocation

The invention claimed is:

1. A method for forming a semiconductor layer, the method comprising:
   (i) crystal-growing, on a substrate, a first semiconductor layer, the first semiconductor layer having a lattice constant in a planar direction of a surface of the substrate which is different from a lattice constant of the substrate in the planar direction of the surface of the substrate;
   (ii) crystal-growing a second semiconductor layer on the first semiconductor layer;
   (iii) selectively dissolving the second semiconductor layer to form a recess at a dislocation portion of the second semiconductor layer, the recess reaching the first semiconductor layer;
   (iv) oxidizing the first semiconductor layer through the recess and forming an insulating film covering a lower surface of the second semiconductor layer; and
   (v) crystal-regrowing the second semiconductor layer after forming the insulating film.

2. The method for forming the semiconductor layer according to claim 1, wherein step (iii) includes etching the dislocation portion of the second semiconductor layer with crystal anisotropy.

3. The method for forming the semiconductor layer according to claim 1, wherein:
   the first semiconductor layer comprises a compound semiconductor containing Al; and
   the second semiconductor layer comprises a compound semiconductor.

4. The method for forming the semiconductor layer according to claim 3, wherein the lattice constant of the first semiconductor layer in the planar direction of the surface of the substrate is closer to the lattice constant of the second semiconductor layer in the planar direction of the surface of the substrate in a region approaching the second semiconductor layer.

5. The method for forming the semiconductor layer according to claim 1, wherein step (i) includes forming a buffer layer on the substrate and then crystal-growing the first semiconductor layer on the buffer layer.

6. The method for forming the semiconductor layer according to claim 5, wherein the buffer layer comprises a compound semiconductor, and the lattice constant of the buffer layer in the planar direction of the surface of the substrate is closer to the lattice constant of the first semiconductor layer in the planar direction of the surface of the substrate in a region approaching the first semiconductor layer.

7. The method for forming the semiconductor layer according to claim 5, wherein the buffer layer comprises a layered structure comprising a first buffer layer comprising GaAs and a second buffer layer comprising InP on the first buffer layer.

* * * * *